United States Patent
Birmiwal et al.

(10) Patent No.: US 7,512,925 B2
(45) Date of Patent: Mar. 31, 2009

(54) SYSTEM AND METHOD FOR REDUCING TEST TIME FOR LOADING AND EXECUTING AN ARCHITECTURE VERIFICATION PROGRAM FOR A SOC

(75) Inventors: Parag Birmiwal, Austin, TX (US); Tilman Gloekler, Gaertringen (DE); Mack W. Riley, Austin, TX (US); Devi Shanmugam, Bangalore (IN); Polisetty V. N. Srinivas, Idupulapadu (IN)

(73) Assignee: International Business Machines Corporation, Armonk, NY (US)

( * ) Notice: Subject to any disclaimer, the term of this patent is extended or adjusted under 35 U.S.C. 154(b) by 370 days.

(21) Appl. No.: 11/457,538

(22) Filed: Jul. 14, 2006

(65) Prior Publication Data

US 2008/0034261 A1 Feb. 7, 2008

(51) Int. Cl.
*G06F 17/50* (2006.01)
*G01R 31/28* (2006.01)
*G01R 31/38* (2006.01)

(52) U.S. Cl. .............................. 716/18; 716/5; 714/729
(58) Field of Classification Search ..................... 716/5, 716/10, 16, 18; 714/725, 729
See application file for complete search history.

(56) References Cited

U.S. PATENT DOCUMENTS

| | | | |
|---|---|---|---|
| 6,539,536 B1 * | 3/2003 | Singh et al. | 716/18 |
| 6,581,191 B1 * | 6/2003 | Schubert et al. | 716/4 |
| 6,618,839 B1 * | 9/2003 | Beardslee et al. | 716/4 |
| 6,766,501 B1 * | 7/2004 | Duggirala et al. | 716/11 |
| 2003/0023941 A1 * | 1/2003 | Wang et al. | 716/4 |
| 2004/0015803 A1 * | 1/2004 | Huang et al. | 716/10 |
| 2005/0204244 A1 | 9/2005 | Ashton et al. | |
| 2006/0123375 A1 * | 6/2006 | Cheng et al. | 716/10 |
| 2006/0206850 A1 * | 9/2006 | McCubbrey | 716/17 |
| 2006/0271899 A1 * | 11/2006 | Tan et al. | 716/13 |
| 2007/0061644 A1 * | 3/2007 | Birmiwal et al. | 714/726 |
| 2007/0136629 A1 * | 6/2007 | Nobekawa | 714/726 |

\* cited by examiner

*Primary Examiner*—Stacy A Whitmore
(74) *Attorney, Agent, or Firm*—Stephen J. Walder, Jr.; Matthew B. Talpis

(57) ABSTRACT

A system and method for reducing test time for loading and executing an architecture verification program for a system-on-a-chip (SoC) are provided. The mechanisms of the illustrative embodiments reorganize the scan chains of the SoC and provide an algorithm for organizing and pipelining architectural verification program (AVP) data for scanning into the reorganized scan chains. The scan chains are reorganized so as to align the scan cells for memory array data for each memory array across a plurality of scan chains. The scan chains are further reorganized so that each scan chain has unique AVP data, i.e. no scan chain has more than one memory array's information. The pipelining algorithm bundles data according to the length of the scan chain, the maximum size of the memory array data, and the position of the memory array's scan cells in the scan chains.

20 Claims, 4 Drawing Sheets

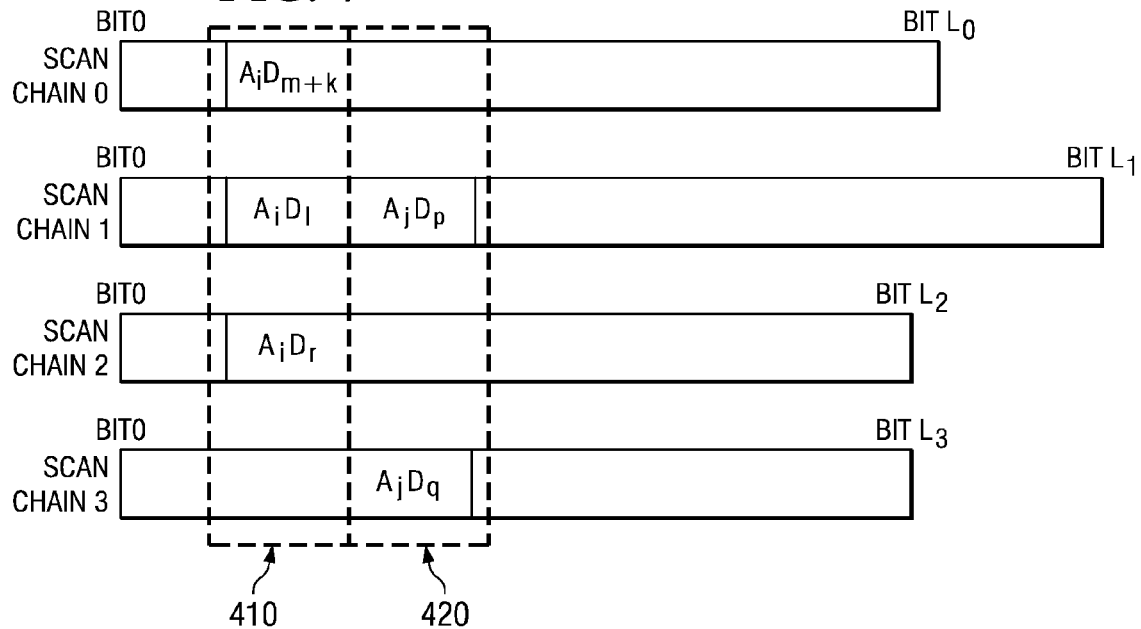
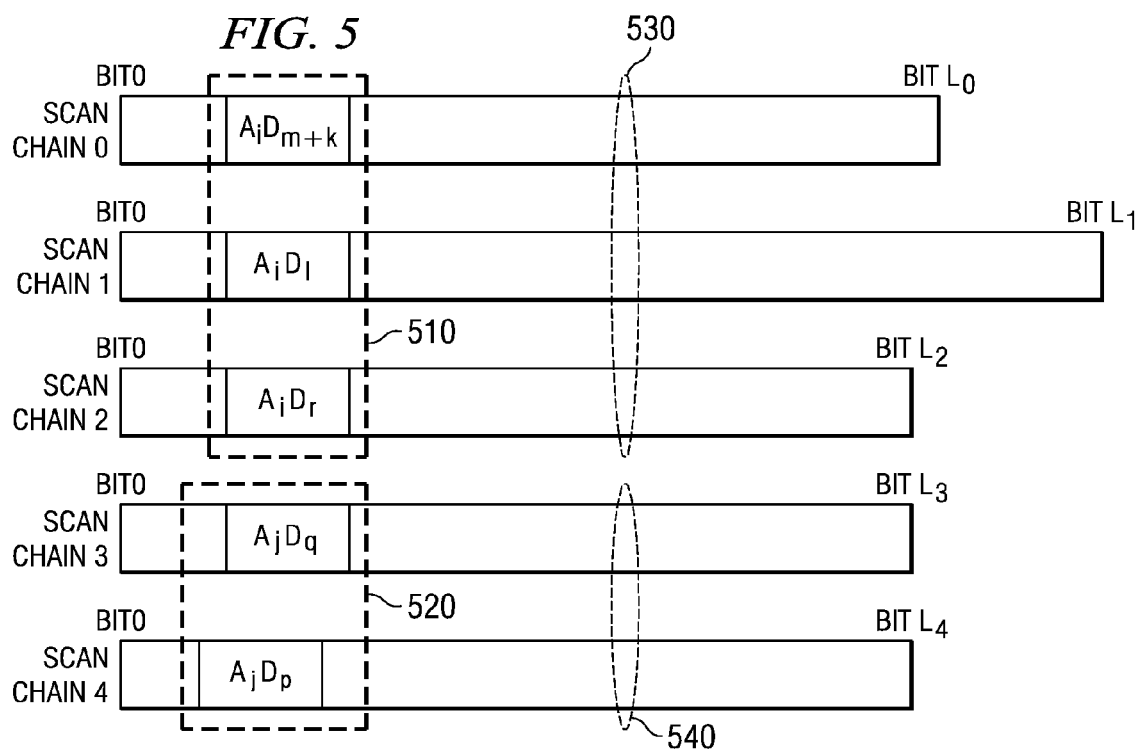

SYSTEM AND METHOD FOR REDUCING TEST TIME FOR LOADING AND EXECUTING AN ARCHITECTURE VERIFICATION PROGRAM FOR A SOC

BACKGROUND

1. Technical Field

The present application relates generally to an improved data processing system and method. More specifically, the present application is directed to a system and method for reducing test time for loading and executing an architecture verification program for a system-on-a-chip (SoC).

2. Description of Related Art

When a microprocessor or system-on-a-chip (SoC) is designed, it is important that the resulting semiconductor integrated circuit chip (IC chip) be tested to ensure proper functioning. Testing the IC chip requires applying test patterns to the IC chip and examining the results of the chip logic operating on those patterns. To introduce patterns to logic fed by memory elements (e.g., latches or flip-flops), scan techniques (such as Level-Sensitive Scan Design (LSSD), Boundary scan, etc.) are often used, wherein the memory elements on the chip are connected to each other in one or more scan chains, such that test patterns can be loaded in via the scan chain and applied to the logic under test. Similarly, this scan chain can be used to read out logical results of logic feeding memory elements.

As the scale of semiconductor integrated circuit integration keeps increasing, devising testing methodologies and circuits for testing the IC chips becomes more and more challenging. A presently widely-used methodology for testing IC chips is the level-sensitive scan design (LSSD) methodology that utilizes boundary scan shift register latches (SRLs) to scan test data into the circuitry under test and scan the output of the circuitry. The scanned output is then compared to a set of expected data outputs to determine whether or not the circuitry is functioning properly.

FIG. 1 illustrates a conventional LSSD methodology 20 that utilizes a scan chain 24 of the SRLs 28 and three LSSD-dedicated clock trees, an A-clock tree 32, a B-clock tree 36, and a C-clock tree 40, for scanning test data into combinational logic or other circuitry (not shown). Each SRL 28 generally includes a master latch 44 and a slave latch 48. Each master latch 44 can be, for example, a two port latch having one data port D1 and one scan-in port SI. Conventionally, C-clock tree 40 is for a C-clock (not shown), or data clock, that activates data ports D1, A-clock tree 32 is for an A-clock (not shown), or shift clock, that activates scan-in ports SI of the master latches 44, and B-clock tree 36 is for a B-clock (not shown), or slave latch clock, that activates slave latches 48 after master latches 44 have latched the corresponding shift values.

During LSSD testing, the A-clock and B-clock are non-overlapping and enable the proper shifting of scan data into master latch 44 of each SRL 28 and out of data output port DO of each slave latch 48. During the test's system cycle phase, the B-clock launches the test data from slave latch 48. A subsequent C clock pulse captures the test response in all of SRLs 28.

In addition to LSSD clock trees 32, 36, and 40, a functional clock tree 52 is present for providing SRLs 28 with a clock for functional operation, as opposed to test operation, of the SRLs. Clock trees 36, 40, and 52, are typically connected to SRLs via one or more clock splitters 56.

Such scan chains may be used, with CPU based SoCs, to accomplish loading of array data of architectural verification programs (AVPs) into a cache memory of the IC chip when the chip is on a tester. The CPU instructions of the AVP may then be executed from the on-chip cache memory. The pass/fail criteria of the AVP determines if the chip is good or bad.

A significant amount of tester time is consumed in the loading of the AVP into the cache memory and unloading of the pass/fail data from the cache memory. The number of clock cycles that the actual AVP executes is extremely small in comparison to the number of clock cycles needed to load and unload the cache memory. This is because the AVP data must be scanned into the cache memory array and programmers typically do not concern themselves with the order in which such AVP data is scanned into the cache memory array or the scan chains used to scan in this AVP data. Because each memory location of the cache memory that needs to be modified to load the AVP program is loaded by a complete scan of the scan chain, a large number of clock cycles may be needed to scan in the AVP data into the cache memory.

For example, assume that the scan chain has a length L. Also assume that there are M number of memory array locations that need to be modified to load the AVP program. Conventionally, the total number of scan clocks to load the AVP into M locations of the cache memory would be M*L. If M and L are typical for an AVP program, then M is approximately 1200 and L is approximately 3000. As a result, the total number of clock cycles required to scan-in the AVP program is approximately 3,600,000 cycles. A similar large number of cycles may be required to unload pass/fail data from the cache memory for similar reasons, i.e. each memory location in the cache memory that contains the pass/fail data must be individually unloaded with a full scan of the scan chain.

The amount of time an IC chip spends on the tester directly contributes to the dollar amount spent on development of the IC chip and adds to the end cost of the chip. Thus, any reduction in the amount of time an IC chip spends on the tester provides a significant cost savings with regard to the development and production of the IC chips.

These problems with loading/unloading of the cache memory are made even more severe when there are multiple memory arrays on the chip that need to be loaded with an AVP, such as in multicore IC chips. Thus, it would be beneficial to reduce the number of clock cycles required to load/unload AVP data in cache memory arrays and thereby reduce the amount of time a chip spends on the tester.

SUMMARY

The illustrative embodiments provide a system and method for reducing test time for loading and executing an architecture verification program for a system-on-a-chip (SoC). The mechanisms of the illustrative embodiments reorganize the scan chains of the SoC and provide an algorithm for organizing and pipelining architectural verification program (AVP) data for scanning into the reorganized scan chains. The mechanisms of the illustrative embodiments reduce test time and chip cost without requiring additional hardware over known tester mechanisms.

The mechanisms of the illustrative embodiments reduce test time and reduce the cost of the SoC by laying out array scan chains in the SoC design in such a way that the array data, address and control bits (collectively referred to herein as "memory array data") are concentrated around particular portions of the scan chains. Moreover, the mechanisms of the illustrative embodiments reduce test time and cost by making sure that the design supports unique sets of scan chains for every array which will be loaded with an AVP for characterization purposes. Finally, the mechanisms of the illustrative embodiments reduce test time and cost by providing a software algorithm that generates a manufacturing pattern which minimizes dummy cycles involved in an AVP load (via a scan operation) by taking into account the various lengths of the scan chains, position of the array data, address and control latches in the scan chains and hence, pipelining the array data to load the AVP program.

In one illustrative embodiment, a method, in a data processing system, for designing an integrated circuit device is provided. The method may comprise receiving an initial integrated circuit design, modifying the initial integrated circuit design, to generate an integrated circuit device design, and outputting the integrated circuit device design to a fabrication system for fabricating the integrated circuit device. The modifying of the initial integrated circuit device design may be performed, for example, by laying out a plurality of scan chains of the integrated circuit device, in the integrated circuit design, in accordance with a set of layout rules. A first layout rule may cause scan cells of the plurality of scan chains for a same memory array of the integrated circuit device to be aligned across the plurality of scan chains.

Laying out the plurality of scan chains may comprise defining a common region at approximately a same location in each of the scan chains in the plurality of scan chains, in which scan cells for the memory array are located. Scan cells may then be laid for the memory array in the scan chains of the plurality of scan chains within the defined common region.

The set of layout rules may further comprise a second layout rule that causes each scan chain of the plurality of scan chains to be laid out such that it is dedicated to a single memory array in the integrated circuit device. Laying out the plurality of scan chains may comprise laying out a first set of scan chains, in the plurality of scan chains, in accordance with the first and second rules such that the first set of scan chains are dedicated to a first memory array in the integrated circuit device and scan cells for the first memory array are aligned to be within a same first common region of the scan chains in the first set of scan chains. Laying out the plurality of scan chains may further comprise laying out a second set of scan chains, in the plurality of scan chains, in accordance with the first and second rules such that the second set of scan chains are dedicated to a second memory array in the integrated circuit device and scan cells for the second memory array are aligned to be within a same second common region of the scan chains in the second set of scan chains.

The method may further comprise fabricating the integrated circuit device in accordance with an integrated circuit device design, generating a data pattern to be scanned-into the plurality of scan chains based on the alignment of scan cells of the plurality of scan chains, scanning-in the data pattern to the plurality of scan chains, and writing the data pattern into the memory array using the scan chains. Scanning-in the data pattern into the plurality of scan chains may comprise pipelining the data pattern into the plurality of scan chains. Scanning-in the data pattern into the plurality of scan chains may further comprise bundling data for a plurality of memory arrays in the integrated circuit device together in accordance with a position of scan cells for the plurality of memory arrays in the plurality of scan chains into which the data is to be loaded and scanning-in the data pattern such that data in the bundle of data is scanned-into the plurality of memory arrays in parallel. The data pattern may correspond to an architecture verification program, for example.

Moreover, the method may comprise modifying the initial integrated circuit design, to generate an integrated circuit device design, by laying out control bits for a plurality of different memory arrays of the integrated circuit device in different dedicated memory array control bit scan chains of the plurality of scan chains.

In other illustrative embodiments, a computer program product comprising a computer useable medium having a computer readable program is provided. The computer readable program, when executed on a computing device, causes the computing device to perform various ones, and combinations of, the operations outlined above with regard to the method illustrative embodiment.

In yet another illustrative embodiment, a system is provided. The system may comprise an integrated circuit design system and a scan chain layout system coupled to the integrated circuit design system. The scan chain layout system may receive an initial integrated circuit design from the integrated circuit design system and may modify the initial integrated circuit design to generate an integrated circuit device design. The modification may be performed by laying out a plurality of scan chains of the integrated circuit device, in the integrated circuit design, in accordance with a set of layout rules. A first layout rule may cause scan cells of the plurality of scan chains for a same memory array of the integrated circuit device to be aligned across the plurality of scan chains. The scan chain layout system may output the integrated circuit device design to a fabrication system for fabricating the integrated circuit device. The set of layout rules may further comprise a second layout rule that causes each scan chain of the plurality of scan chains to be laid out such that it is dedicated to a single memory array in the integrated circuit device.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 4 is an exemplary diagram illustrating a layout of array scan cells in a scan chain in accordance with one illustrative embodiment;

FIG. 5 is an exemplary diagram illustrating the organization of scan chains such that each scan chain has unique AVP array data in accordance with one illustrative embodiment;

DETAILED DESCRIPTION OF THE ILLUSTRATIVE EMBODIMENTS

The illustrative embodiments provide a system and method for reducing test time for loading and executing an architecture verification program for a system-on-a-chip (SoC). The mechanisms of the illustrative embodiment involve applying layout rules for the layout of scan chains in a SoC and applying a software algorithm for pipelining architectural verification program (AVP) data into the scan chains. The layout rules ensure that the SoC chip is laid out such that the array data, address and control bits are concentrated around particular portions of the scan chains. Moreover, the layout rules ensure that a unique set of scan chains are provided for every array which is loaded with AVP data for characterizing the SoC chip.

Figure 1:
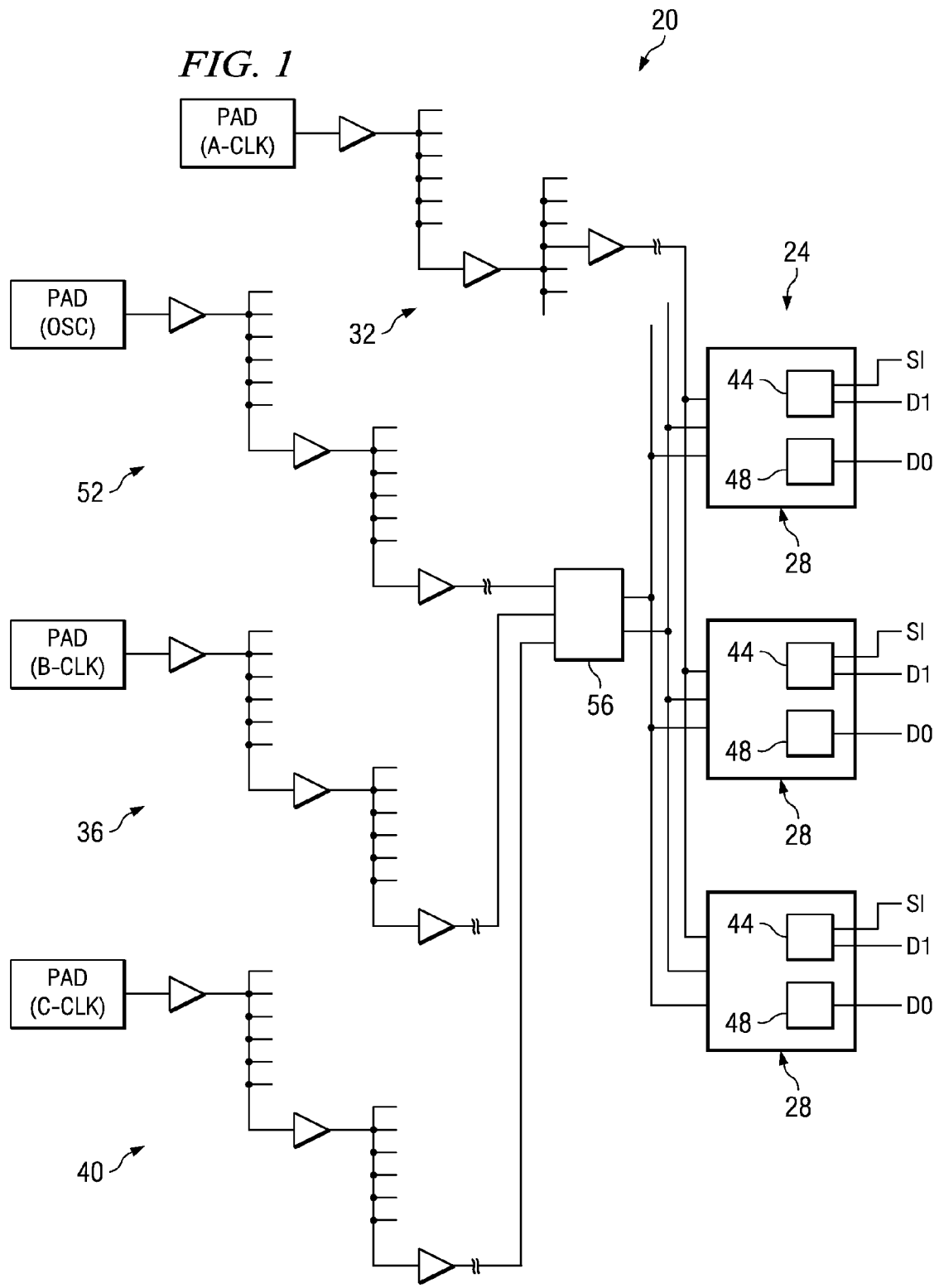
FIG. 1 illustrates a conventional LSSD methodology that utilizes a scan chain of the SRLs in accordance with a known methodology.
Figure 2:
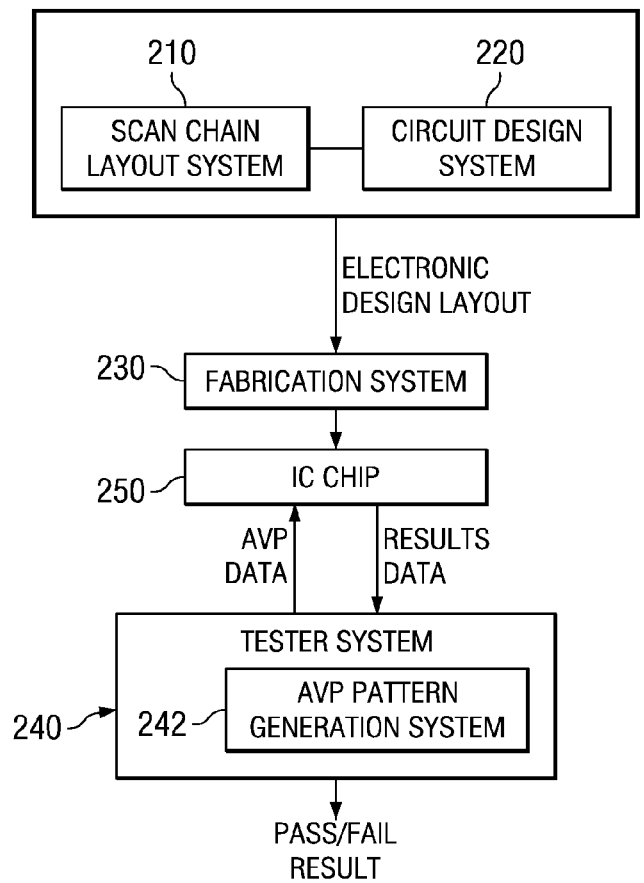
FIG. 2 is an exemplary block diagram of a scan chain layout and tester system for testing an IC chip in accordance with one illustrative embodiment.

FIG. 2 is an exemplary block diagram of a scan chain layout and tester system for testing an IC chip in accordance with one illustrative embodiment. As shown in FIG. 2, the tester system includes a scan chain layout system 210, circuit design system 220, chip fabrication system 230, and tester system 240. The tester system 240 includes an AVP pattern generator 242 for scanning-in AVP address, data, and control information into the scan chains of the integrated circuit (IC) chip 250 laid out by the scan chain layout system 210 and fabricated using the chip fabrication system 230.

The circuit design system 220 may be any of a number of different types of integrated circuit design systems generally known in the art. Many different types of computer aided design (CAD) systems have been developed to aid designers in generating integrated circuit designs and any of these known or later developed systems are intended to be within the spirit and scope of the present invention.

Typically, in the IC chip fabrication process, the circuit design system 220, which may include a CAD based system, is used to create a functional circuit design and translate the functional circuit design into an electronic design layout file that represents various levels of an integrated circuit, i.e. represents a physical device layer-by-layer. The result is a design layout that describes each level of the device from the lowest level, for example a transistor level, up to higher levels, for example interconnect layers that transmit signals among transistors and supply power to the components on the IC chip. The electronic design layout files are used to finalize a design or "tape-out" the design before creating lithography masks. This "tape-out" of the design generates specifications for making a lithography mask. The lithography masks are then manufactured by the chip fabrication system 230 based on the mask specifications. The chip fabrication system 230 uses these lithography masks with a photolithography tool to print circuit patterns onto a wafer covered with photosensitive film. In this way, circuit features are transferred to the wafer to generate the IC chip 250.

In most modern day SoC designs, no specific care is taken while laying out the array scan cells in a scan chain, i.e. the data, address, and control latches of an array are spread out in various scan chains and not concentrated on a particular section of a scan chain/group of scan chains. Moreover, as the complexity of SoCs increases, many memory arrays available in a chip may be used for characterization purposes on a tester through AVP load. To enable faster AVP load, it would be convenient if each memory array is assigned a distinct set of scan chains. This would enable parallel loading of array data for the AVP program.

The illustrative embodiments provide a scan chain layout system 210 which works in conjunction with, or may be integrated with, the circuit design system 220 to generate scan chains in accordance with the scan chain layout rules of the illustrative embodiments which address the above issues. The scan chain layout system 210 essentially enforces two design rules for laying out cache memory array scan cells in a scan chain. The first design rule is that the scan chains are laid out so that the array address, data, and control information scan cells are concentrated on a specific area in a set of scan chains. The second design rule is that each scan chain has unique AVP array data, i.e. no scan chain can have more than one array's data, while taking into consideration the first rule mentioned above. These rules, will be further described with reference to FIGS. 3-5 below.

Figure 3:
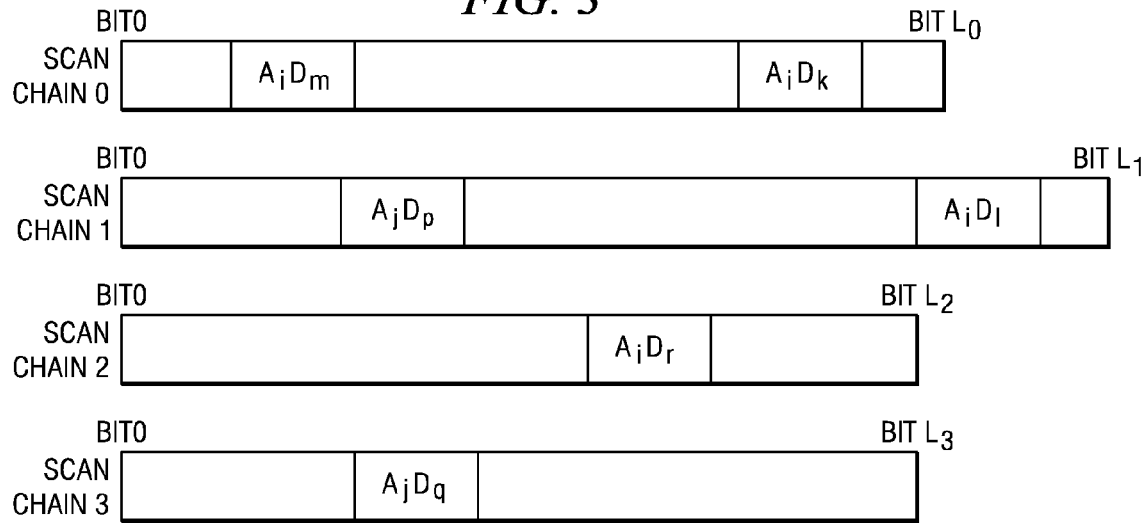
FIG. 3 is an exemplary diagram illustrating a layout of array scan cells in a scan chain in accordance with a known tester mechanism.

FIG. 3 is an exemplary diagram illustrating a layout of array scan cells in a scan chain in accordance with a known tester mechanism. As shown in FIG. 3, a plurality of scan chains 0-3 are provided for scanning-in tester data into the memory arrays of the IC chip. For example, the scan chains 0-3 may be utilized for scanning in an architecture verification program (AVP) into the memory arrays. Each scan chain 0-3 may have a same or different length from other ones of the scan chains 0-3. The length of the scan chains is denoted in FIG. 3 as $L_n$ where n is the nth scan chain.

In the example depicted in FIG. 3, it is assumed that two different memory arrays are utilized, i.e. array I and array J. In the example shown in FIG. 3, and the description set forth hereafter, "$A_i$" and "$A_j$" denote the two arrays I and J. The address, data, and control bits are denoted "$D_x$".

As can be seen from FIG. 3, in modern day SoC designs, no specific care is taken when laying out the array scan cells, i.e. latches, in a scan chain and thus, the data, address and control latches of an array are spread out in a plurality of scan chains and their positions in these various scan chains are not aligned with each other across the scan chains. That is, rather than being concentrated on a particular section of the scan chains, i.e. at approximately a same relative position in each of the scan chains, the latches or array scan cells for the address, data, and control bits of an array I may be in a first section of a first scan chain, a second section of a second scan chain, and a third section of a third scan chain, with the first, second, and third sections being non-aligned.

For example, the address and data information for memory array I is spread out over scan chains 0, 1 and 2 in FIG. 3. Moreover, the position of the address, data and control information for memory array I in the various scan chains are not at the same relative position in the scan chains. For example, $A_iD_m$ is near bit 0 of scan chain 0 while $A_iD_1$ is near bit $L_1$ of scan chain 1 rather than near bit 0. Similarly, $A_iD_k$ is near bit $L_0$ of scan chain 0 and $A_iD_r$ is approximately equidistant from bit 0 and bit $L_2$ of scan chain 3.

Thus, in order to scan in the necessary data for loading the AVP into the memory array I, the difference in position of the memory array I data in the various scan chains must be accounted for. Typically, in order to simplify matters when accounting for these differences in position, the entire scan chain is completely shifted-in for each portion of memory array I data, i.e. the memory array I data is shifted from bit $L_n$ to bit 0 and loaded into the memory array from bit 0, where $L_n$ denotes the last bit of the nth scan chain.

The typical way of doing this is to use the maximum scan chain length, i.e. Max (L0 . . . L3), as the basis for determining the number of scan clock cycles that are required to scan-in the scan chains. The software that generates array scan data knows the positions of the array latches in the scan chains and the scan chain lengths. As all the scan chains are scanned in parallel for the same number of cycles, i.e. max (L0 . . . L3), the software generates a data pattern with dummy data padded into the actual data pattern for the scan chains. For example, in FIG. 3, dummy data may be added to the data pattern in those portions of the scan chains that are blank in the drawing, with useful data being only at the indicated locations denoted by "$A_xD_y$." In essence, these dummy cycles align the memory array I data with the memory array's scan cells, or latches, so that it can be written to the memory array I.

The introduction of the dummy data, which generates dummy cycles in the scanning-in operation, and the requirement to shift in the entire scan chain for each portion of memory array data increases the time required to load the AVP program into the memory array. In fact, the number of clock cycles required to load an AVP program is approximately the number (M) of memory array locations that need to be modified to load the AVP program times the maximum length (L) of the scan chains, i.e. M*L. For an AVP having 1200 memory array locations to be modified and a maximum scan chain length of 3000 latches, the number of clock cycles to load the AVP may be approximately 3,600,000.

With the illustrative embodiments, the scan chain layout engine 210 enforces a first design rule for aligning the address, data, and control latches for a memory array across each of a plurality of scan chains such that the address, data, and control latches for a memory array are in a same given region of each of the scan chains, e.g., L(x:y), where x is a starting scan chain position and y is an ending scan chain position for the region. By so aligning the latches for a memory array across the plurality of scan chains, the number of clock cycles required to load an AVP into a memory array may be reduced.

This first design rule may be enforced by the scan chain layout engine 210 either with regard to the automatic introduction of scan chains into a circuit design or with regard to verification of scan chains of a circuit design created by a designer using the circuit design system 220. In either case, the scan chain layout engine 210 ensures that scan chains in the circuit design have latches for memory arrays that are aligned such that the number of cycles that are required for scanning in the memory array data for a particular memory array is reduced.

FIG. 4 is an exemplary diagram illustrating a layout of array scan cells, or latches, in a scan chain in accordance with one illustrative embodiment. As shown in FIG. 4, the first design rule enforced by the scan chain layout engine 210 causes the address, data, and control scan cells, or latches, to be positioned within each scan chain such that they are concentrated on a specific area in a set of scan chains. Thus, the address, data, and control scan cells need not be perfectly aligned at the same positions in the scan chains, but must be within approximately a same well defined region in each of the scan chains. When data is scanned-in to this region of the scan chains, it is read at the inputs of the memory array. The operation may be shifted from a scan mode to a read/write mode in which data scanned into the region may be read from and/or written to the memory array.

As shown in FIG. 4, the memory array I scan cells are located within the region denoted by the dashed line box 410. That is, the scan cells for memory array I are aligned across the scan chains 0-3 such that $A_ID_{m+K}$, $A_ID_1$, and $A_ID_r$ are all approximately at the same location within each of the scan chains 0-3, i.e. all are within the well defined region 410 (in FIG. 4, the subscript "m+k" refers to the data pertaining to array I in scan chain 0, i.e. $A_ID_m$ and $A_ID_k$, being combined).

Similarly, the scan cells, or latches, corresponding to memory array J are concentrated in the region denoted by the dashed line box 420 in FIG. 4. As discussed hereafter, care is taken when pipelining data for memory arrays I and J into the scan chains so as to consider that there is another memory array whose data cannot be rearranged. If $A_i$ has a bit range maximum of X and $A_j$ has a bit range maximum of Y, then the pipelining mechanisms of the illustrative embodiments may bundle data in groups of "X+Y," for example.

As an example of the formation of region 410 or 420, it may be determined that the maximum size of each portion of memory array data that is to be loaded into the memory array is 10 bits. As a result, the region 410 may have a width of 10 bits in each scan chain 0-3. Alternatively, the region 410 may be made larger if additional tolerance is desired with regard to the positioning of the memory array data in the scan chains 0-3. Thus, for example, if the maximum memory array data size is 10 bits, a region 410 of 16 bits may be established for the memory array data.

The region 410 has a starting bit location, or offset from bit 0, in each scan chain 0-3 and an ending bit location in each scan chain 0-3. These starting and ending bit locations are preferably the same in each scan chain 0-3 so as to ensure alignment of the memory array data. These starting and ending bit locations correspond to scan cells, or latches, within the scan chains. Thus, for a region 410 of 10 bits, and a starting bit for the region being bit 10, the scan cells associated with bits 10-20 are associated with memory array I, for example. While the starting and ending bit locations are preferably the same in each scan chain, this does not necessary mean that the actual data loaded into the scan chain for the memory array must be the same size, i.e. 10 bits. To the contrary, the memory array data may be any size up to the maximum size for the memory array data.

In addition to aligning the scan cells for a memory array across a plurality of scan chains, the scan chain layout engine 210 and AVP pattern generation engine 242 of the illustrative embodiments further enforce a second rule for the layout of scan chains that causes each scan chain to have unique AVP array data such that no scan chain can have more than one memory array's AVP data. By forcing each scan chain to only receive one memory array's AVP data, parallel loading of memory array data may be made possible, thereby increasing the speed by which the AVP data is loaded into the memory array and reducing the amount of time the chip must stay on the tester equipment.

FIG. 5 is an exemplary diagram illustrating the organization of scan chains such that each scan chain has unique AVP array data in accordance with one illustrative embodiment. As shown in FIG. 5, each memory array I and J are assigned a distinct set of scan chains taking into consideration the first design rule set forth above with regard to FIG. 4. Thus, for example, scan chains 0-2 are assigned to a first scan chain set 530 associated with memory array I, while scan chains 3 and 4 are assigned to a second scan chain set 540 associated with memory array J. Within each scan chain set 530 and 540, the memory array data is aligned across the scan chains within the defined regions 510 and 520 in accordance with the first scan chain layout rule described previously with regard to FIG. 4.

The alignment of the memory array data across the scan chains is utilized with the dedicated scan chains of this illustrative embodiment because all of the scan chains are controlled by the same scan control signals. Thus, the scan chain sets 530 and 540 do not have individual controls. In other words, a different number of scan cycles cannot be used for each individual scan chain. As a result, in order to achieve a maximum number of memory writes within a minimum number of scan cycles, the widths of the regions 510 and 520 in the scan chains are optimized. For example, if region 510 is 10 bits wide and region 520 is 40 bits wide, a number of scan cycles required to scan-in the memory array data for memory arrays I and J would be 40 scan cycles.

By dedicating sets of scan chains to particular memory arrays, memory array data may be pipelined into the scan chains with the assurance that another memory array's data will not be intermixed into the stream of memory array data. Thus, a first set of memory array data may be loaded into the memory array from the memory array's set of scan chains and the data may be processed on the chip in a functional mode of operation while other memory array data is staged in the scan chains of the memory array's scan chain set. Thus, while the chip is operating on AVP data in a functional mode, additional AVP data may be being loaded into the memory array, before it is required by the executing AVP on the chip, via the scan chains of the memory array's scan chain set.

With these two rules, the scan chain layout engine 210 may either automatically generate scan chains, or verify existing scan chains, in the circuit design that abide by these two rules. In other words, as the scan cells of the scan chains are added to the circuit design, the scan chain layout engine 210 may ensure that the scan cells are part of a scan chain that is dedicated to a single memory array and that the scan chain cells are aligned properly within a designated region of the scan chain. Alternatively, the scan chain layout engine 210 may traverse existing scan chains of a circuit design and determine if either of these two rules are violated by the existing scan chain layout and provide an indication of such violations to a human designer.

The use of rules and enforcing the adherence to rules in circuit design systems is generally known in the art and thus, similar mechanisms may be used to enforce the rules of the illustrative embodiments. However, it should be appreciated that while rules enforcement is generally known, the particular rules of the illustrative embodiments have not been known prior to the present invention.

Having laid out the scan chains in accordance with the two scan chain layout rules set forth above using the scan chain layout engine 210. The AVP data may be generated and scanned-into the chip via the scan chains. The illustrative embodiments provide a mechanism for organizing the AVP data so as to pipeline the AVP data for the memory arrays. As a result, the loading and execution of the AVP data may be made faster and time on the tester equipment may be reduced. Such organization of the AVP data may be performed, for example, by the AVP pattern generator 242 of the tester system 240 in FIG. 2, for example, when loading the AVP into the chip 250 for testing of the chip 250.

The illustrative embodiments for pipelining the AVP data organizes the AVP data based on the length of the scan chains into which the AVP data is to be scanned, the maximum size of the memory array data, and the position of the scan cells for the memory array data in the scan chains, i.e. the defined region of the scan chains for the particular memory array's data. The AVP data for each scan chain is bundled according to memory location in the memory arrays to which the AVP data is to be loaded and is then scanned in. The basic concept is to use the complete scan chain as a pipeline and preload new AVP data in scan locations before the actual memory array latches. This allows many memory locations to be loaded with one complete scan of a scan chain.

Figure 6:
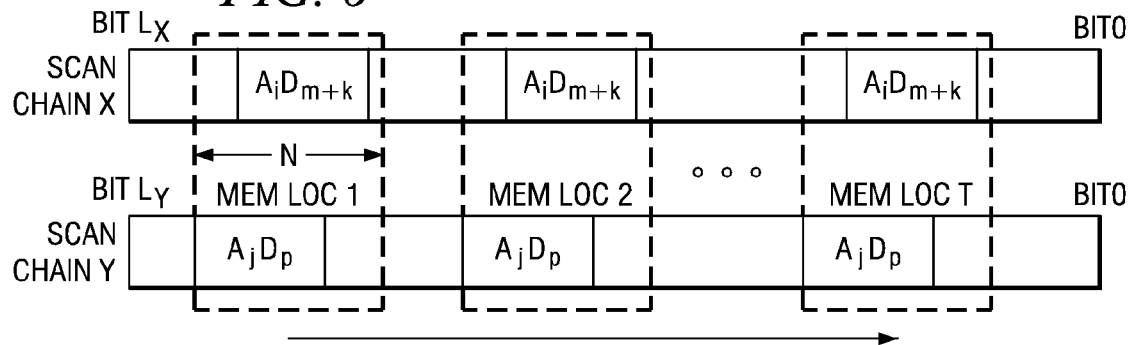
FIG. 6 is an exemplary diagram illustrating the pipelining of array data while generating a manufacturing test pattern for AVP load in accordance with one illustrative embodiment.

FIG. 6 is an exemplary diagram illustrating the pipelining of array data while generating a manufacturing test pattern for AVP load in accordance with one illustrative embodiment. While FIG. 6 shows only one scan chain for each memory array I and J, it should be appreciated that these scan chains are representative of a scan chain set and thus, one or more scan chains may be used to scan-in AVP data for a memory array in a pipelined fashion. Moreover, while scan chain sets for only two different memory arrays I and J are shown in FIG. 6, it should be appreciated that any number of memory arrays may be provided on a SoC and thus, any number of scan chain sets may be used in accordance with the illustrative embodiments as described herein.

The scan chain sets shown in FIG. 6 are laid out in accordance with the rules set forth above. Thus, each scan chain set is comprised of one or more scan chains that are dedicated to a single memory array of the SoC. Within the scan chain sets, scan cells of the scan chain sets are aligned in accordance with the first rule described above.

As shown in FIG. 6, for each location of the memory array that needs to be scanned in, N is the number of bits of address, data, and control information that needs to be scanned-in. The AVP data for each memory array is scanned-in in order of memory location in the corresponding memory array to which the AVP data is to be loaded. Thus, the AVP data, e.g., $A_iD_{m+k}$, for a first memory location in memory array I is bundled with the AVP data, e.g., $A_jD_p$, for a first memory location in memory array J, as denoted by the dashed box which represents a bundling of AVP data. Similarly, the AVP data, e.g., $A_iD_{m+k-1}$, for a second memory location of memory array I may be bundled with the AVP data, e.g., $A_jD_{p-1}$, for the second memory array location in memory array J.

Thus, with the illustrative embodiments, AVP data for a plurality of memory arrays may be loaded into the scan chain sets in parallel. Such parallel loading is made possible by the layout of the scan chain sets being dedicated to a single memory array and by the use of an algorithm implemented by the tester system to bundle AVP data for the various memory arrays in accordance with the memory locations to which the AVP data is to be loaded. The tester system may then scan-in the bundled AVP data in accordance with the generated bundles such that the AVP data for the plurality of memory arrays is scanned-in in parallel. In so doing, the speed at which AVP data may be scanned-into the chip is increased, time on the tester equipment is decreased, and the overall cost of the chip is decreased.

For example, assume a scan chain has a length of 160 bits and a maximum of 10 bits per array per scan chain. By arranging the scan chains as described above and pipelining data into these aligned scan chains, 8 memory locations of each array((10Ai+10Aj)*8) can be written in 1 loop of scanning the complete chain, i.e. 160 scan clocks. In the conventional mechanisms in which the scan chains are not aligned and memory array data is not pipelined into the scan chains, a maximum of 1 memory write for each memory array $A_i$ and $A_j$ may be performed within 1 loop of scanning, or 160 scan clocks.

Figure 7:
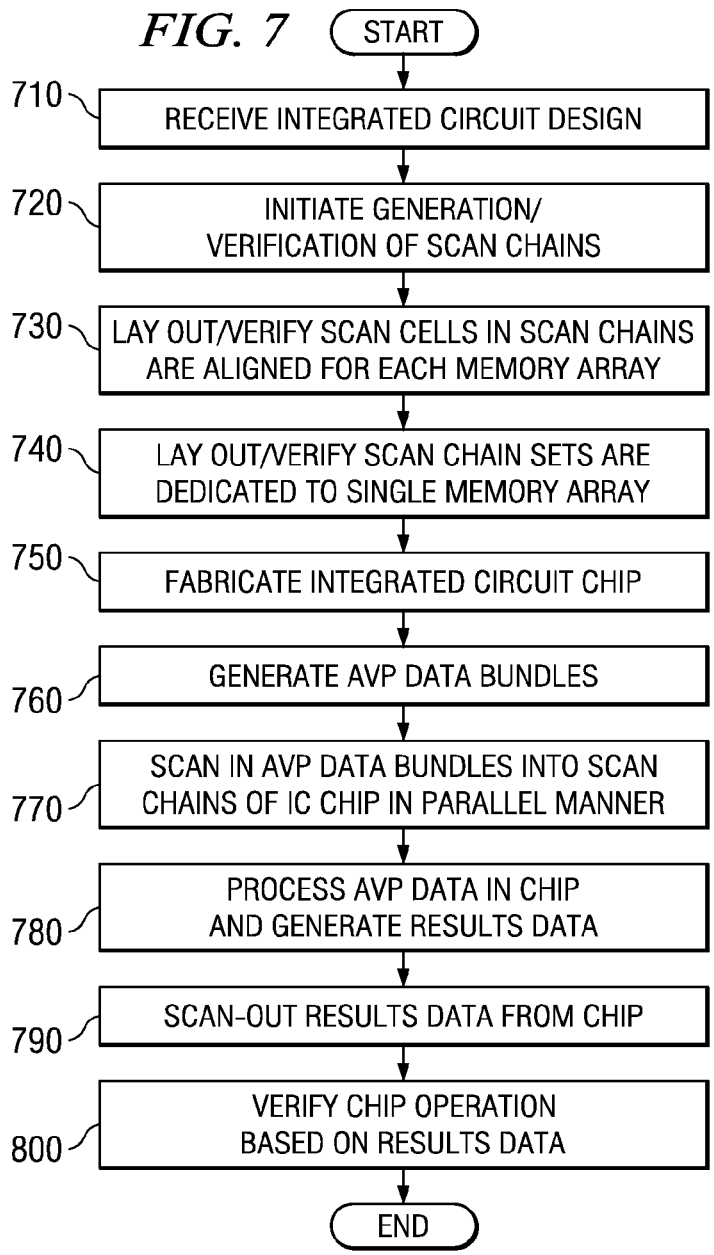
FIG. 7 is a flowchart outlining an exemplary operation for loading an AVP program into a cache memory of a SoC in accordance with one illustrative embodiment.

FIG. 7 is a flowchart outlining an exemplary operation for loading an AVP program into a cache memory of a SoC in accordance with one illustrative embodiment. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 7, the operation starts with a scan chain layout engine receiving an integrated circuit design from an integrated circuit design system (step 710). The scan chain layout engine then initiates generation or verification of scan chains in the circuit design in accordance with the rules set forth herein above (step 720). The scan chain layout engine lays out, or verifies the layout of the scan chains, as having scan cells for memory arrays aligned within designated fields of the scan chains in accordance with a first scan chain layout rule (step 730). The scan chain layout engine lays out, or verifies the layout of the scan chains, as having sets of scan chains that are dedicated to particular memory arrays in accordance with a second scan chain layout rule (step 740).

The chip is then fabricated based on the integrated circuit design and scan chain layout (step 750). An AVP pattern generator generates bundles of AVP data for scanning-into the chip for the various memory arrays of the chip based on the length of the scan chains, the maximum size of the array data, and the position of the array data in the scan chains (step 760). The bundles of AVP data are then scanned-into the chip in a pipelined fashion (step 770). The chip processes the AVP data and results data is generated and stored in the memory arrays (step 780). The results data are then scanned-out of the chip using the scan chains (step 790) and used to verify the chip operation by comparison to expected results data (step 800). The operation then terminates.

Thus, the illustrative embodiments provide a mechanism for increasing the speed at which AVP data may be scanned-into memory arrays of a chip, such as a system-on-a-chip. The mechanisms of the illustrative embodiments reorganize the scan chains such that the scan chains are dedicated to a single memory array and are aligned. The mechanisms further provide an algorithm for bundling AVP data so as to permit parallel loading of memory arrays on the chip.

By utilizing the mechanisms of the illustrative embodiments, a significant number of clock cycles may be saved when loading AVP data into a chip. For example, as mentioned above, the conventional mechanism for loading AVP data requires M*L cycles to load the AVP data, where M is the number of memory array locations that are to be modified to load the AVP and L is the length of the scan chains. With the illustrative embodiments, the number of clock cycles required is approximately N*M, where N is the number of bits for address, data, and control information per scan chain that needs to be scanned for each location of a memory array. Thus, if N is 300 bits, M is 1200 memory array locations, and L is 3000 bits, then the conventional methodology requires 3,600,000 cycles while the illustrative embodiments require only 360,000. Thus, the illustrative embodiments require only approximately 10% of the number of cycles used in the conventional methodology. Hence, approximately 90% of the tester time used for the scanning-in of the AVP data are dummy cycles in the conventional approach which can be substantially eliminated by utilization of the illustrative embodiments. Some small percentage of dummy cycles may remain in the illustrative embodiments herein, such as due to variability within the defined regions where the memory array data may be located, but the percentage of dummy cycles is negligible when compared to conventional methods of scanning-in AVP data.

An optimization of the performance of the above illustrative embodiments may be achieved by laying out only the control bits of the different memory arrays in different scan chains and keeping the data/address bits in the same scan chains. This will achieve the same benefit as providing dedicated scan chains for each memory array, but avoids any resource issues due to a limited number of scan chains. If the control bits of the memory arrays are in different, dedicated memory array control bit scan chains, it does not matter whether the address and data bits of multiple memory arrays are in the same scan chain since the control bits may effectively separate out the address/data for each memory array.

It should be appreciated that the illustrative embodiments may take the form of an entirely hardware embodiment, an entirely software embodiment or an embodiment containing both hardware and software elements. In one exemplary embodiment, the mechanisms of the illustrative embodiments are implemented in software, which includes but is not limited to firmware, resident software, microcode, etc.

Furthermore, the illustrative embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems r remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for designing an integrated circuit device, comprising:
receiving an initial integrated circuit design;
modifying the initial integrated circuit design, to generate an integrated circuit device design, by laying out a plurality of scan chains of the integrated circuit device, in the integrated circuit design, in accordance with a set of layout rules, wherein a first layout rule causes scan cells of the plurality of scan chains for a same memory array of the integrated circuit device to be aligned across the plurality of scan chains; and
outputting the integrated circuit device design to a fabrication system for fabricating the integrated circuit device.

2. The method of claim 1, wherein laying out the plurality of scan chains comprises:
defining a common region at approximately a same location in each of the scan chains in the plurality of scan chains, in which scan cells for the memory array are located; and
laying out scan cells for the memory array in the scan chains of the plurality of scan chains within the defined common region.

3. The method of claim 1, wherein the set of layout rules comprises a second layout rule that causes each scan chain of the plurality of scan chains to be laid out such that it is dedicated to a single memory array in the integrated circuit device.

4. The method of claim 3, wherein laying out the plurality of scan chains further comprises:
laying out a first set of scan chains, in the plurality of scan chains, in accordance with the first and second rules such that the first set of scan chains are dedicated to a first memory array in the integrated circuit device and scan cells for the first memory array are aligned to be within a same first common region of the scan chains in the first set of scan chains; and
laying out a second set of scan chains, in the plurality of scan chains, in accordance with the first and second rules such that the second set of scan chains are dedicated to a second memory array in the integrated circuit device and scan cells for the second memory array are aligned to be within a same second common region of the scan chains in the second set of scan chains.

5. The method of claim 1, further comprising:
fabricating the integrated circuit device in accordance with an integrated circuit device design;
generating a data pattern to be scanned-into the plurality of scan chains based on the alignment of scan cells of the plurality of scan chains;
scanning-in the data pattern to the plurality of scan chains; and
writing the data pattern into the memory array using the scan chains.

6. The method of claim 5, wherein scanning-in the data pattern into the plurality of scan chains comprises pipelining the data pattern into the plurality of scan chains.

7. The method of claim 5, wherein scanning-in the data pattern into the plurality of scan chains comprises:
bundling data for a plurality of memory arrays in the integrated circuit device together in accordance with a position of scan cells for the plurality of memory arrays in the plurality of scan chains into which the data is to be loaded; and
scanning-in the data pattern such that data in the bundle of data is scanned-into the plurality of memory arrays in parallel.

8. The method of claim 5, wherein the data pattern corresponds to an architecture verification program.

9. The method of claim 1, wherein modifying the initial integrated circuit design, to generate an integrated circuit device design, comprises laying out control bits for a plurality of different memory arrays of the integrated circuit device in different dedicated memory array control bit scan chains of the plurality of scan chains.

10. A computer program product comprising a computer useable medium having a computer readable program, wherein the computer readable program, when executed on a computing device, causes the computing device to:
receive an initial integrated circuit design;
modify the initial integrated circuit design, to generate an integrated circuit device design, by laying out a plurality of scan chains of the integrated circuit device, in the integrated circuit design, in accordance with a set of layout rules, wherein a first layout rule causes scan cells of the plurality of scan chains for a same memory array of the integrated circuit device to be aligned across the plurality of scan chains; and
output the integrated circuit device design to a fabrication system for fabricating the integrated circuit device.

11. The computer program product of claim 10, wherein the computer readable program causes the computing device to layout the plurality of scan chains by:
defining a common region at approximately a same location in each of the scan chains in the plurality of scan chains, in which scan cells for the memory array are located; and
laying out scan cells for the memory array in the scan chains of the plurality of scan chains within the defined common region.

12. The computer program product of claim 10, wherein the set of layout rules comprises a second layout rule that causes each scan chain of the plurality of scan chains to be laid out such that it is dedicated to a single memory array in the integrated circuit device.

13. The computer program product of claim 12, wherein the computer readable program further causes the computing device to layout the plurality of scan chains by:
laying out a first set of scan chains, in the plurality of scan chains, in accordance with the first and second rules such that the first set of scan chains are dedicated to a first memory array in the integrated circuit device and scan cells for the first memory array are aligned to be within a same first common region of the scan chains in the first set of scan chains; and
laying out a second set of scan chains, in the plurality of scan chains, in accordance with the first and second rules such that the second set of scan chains are dedicated to a second memory array in the integrated circuit device and scan cells for the second memory array are aligned to be within a same second common region of the scan chains in the second set of scan chains.

14. The computer program product of claim 10, wherein the fabrication system fabricates the integrated circuit device in accordance with the integrated circuit device design, and wherein the computer readable program further causes the computing device to:

generate a data pattern to be scanned-into the plurality of scan chains based on the alignment of scan cells of the plurality of scan chains; and scan-in the data pattern to the plurality of scan chains, wherein the data pattern is written into the memory array using the scan chains.

15. The computer program product of claim 14, wherein the computer readable program causes the computing device to scan-in the data pattern into the plurality of scan chains by pipelining the data pattern into the plurality of scan chains.

16. The computer program product of claim 14, wherein the computer readable program causes the computing device to scan-in the data pattern into the plurality of scan chains by:

bundling data for a plurality of memory arrays in the integrated circuit device together in accordance with a position of scan cells for the plurality of memory arrays in the plurality of scan chains into which the data is to be loaded; and scanning-in the data pattern such that data in the bundle of data is scanned-into the plurality of memory arrays in parallel.

17. The computer program product of claim 14, wherein the data pattern corresponds to an architecture verification program.

18. The computer program product of claim 10, wherein the computer readable program causes the computing device to modify the initial integrated circuit design, to generate an integrated circuit device design, by laying out control bits for a plurality of different memory arrays of the integrated circuit device in different dedicated memory array control bit scan chains of the plurality of scan chains.

19. A system, comprising:

an integrated circuit design system; and a scan chain layout system coupled to the integrated circuit design system, wherein the scan chain layout system receive an initial integrated circuit design from the integrated circuit design system and modifies the initial integrated circuit design, to generate an integrated circuit device design, by laying out a plurality of scan chains of the integrated circuit device, in the integrated circuit design, in accordance with a set of layout rules, wherein a first layout rule causes scan cells of the plurality of scan chains for a same memory array of the integrated circuit device to be aligned across the plurality of scan chains, and wherein the scan chain layout system output the integrated circuit device design to a fabrication system for fabricating the integrated circuit device.

20. The system of claim 19, wherein the set of layout rules comprises a second layout rule that causes each scan chain of the plurality of scan chains to be laid out such that it is dedicated to a single memory array in the integrated circuit device.

* * * * *